United States Patent [19]
Ganesan et al.

[11] Patent Number: 5,666,370
[45] Date of Patent: Sep. 9, 1997

[54] HIGH PERFORMANCE ERROR CONTROL CODING IN CHANNEL ENCODERS AND DECODERS

[75] Inventors: Kalyan Ganesan, Germantown; Kumar Swaminathan, Gathersberg; Prabhat Gupta, Germantown, all of Md.; P. Vijay Kumar, Santa Monica, Calif.

[73] Assignee: Hughes Electronics, Los Angeles, Calif.

[21] Appl. No.: 591,127

[22] Filed: Jan. 25, 1996

Related U.S. Application Data

[63] Continuation of Ser. No. 119,778, Sep. 10, 1993.
[51] Int. Cl.[6] .................................................. G06F 11/08
[52] U.S. Cl. .................. 371/37.01; 371/43.1; 375/286
[58] Field of Search ............................. 371/37.1, 37.4, 371/37.6, 37.7, 43, 44, 45; 370/294, 321, 347; 375/264, 265, 260, 286

[56] References Cited

U.S. PATENT DOCUMENTS

| | | | |
|---|---|---|---|
| 4,896,353 | 1/1990 | Dehgani et al. | 380/6 |
| 5,113,400 | 5/1992 | Gould et al. | 371/43 |
| 5,148,431 | 9/1992 | Hayashi | 371/5.5 |
| 5,182,753 | 1/1993 | Dahlin et al. | 371/43 |
| 5,255,343 | 10/1993 | Su | 395/2.51 |
| 5,265,127 | 11/1993 | Betts et al. | 375/39 |
| 5,289,501 | 2/1994 | Seshadri et al. | 375/17 |
| 5,321,705 | 6/1994 | Gould et al. | 371/43 |

OTHER PUBLICATIONS

G. David Forney, Jr.; "Coset Codes—Part II: Binary Lattices and Related Codes"; 1988; IEEE Transactions on Information Theory pp. 1152–1187.

*Primary Examiner*—Reba I. Elmore
*Assistant Examiner*—Brian C. Oakes
*Attorney, Agent, or Firm*—John T. Whelan; Wanda Denson-Low

[57] ABSTRACT

An improved error control coding scheme is implemented in low bit rate coders in order to improve their performance in the presence of transmission errors typical of the digital cellular channel. The error control coding scheme exploits the nonlinear block codes (NBCs) for purposes of tailoring those codes to a fading channel in order to provide superior error protection to the compressed half rate speech data. For a half rate speech codec assumed to have a frame size of 40 ms, the speech encoder puts out a fixed number of bits per 40 ms. These bits are divided into three distinct classes, referred to as Class 1, Class 2 and Class 3 bits. A subset of the Class 1 bits are further protected by a CRC for error detection purposes. The Class 1 bits and the CRC bits are encoded by a rate ½ Nordstrom Robinson code with codeword length of 16. The Class 2 bits are encoded by a punctured version of the Nordstrom Robinson code. It has an effective rate of 8/14 with a codeword length 14. The Class 3 bits are left unprotected. The coded Class 1 plus CRC bits, coded Class 2 bits, and the Class 3 bits are mixed in an interleaving array of size 16×17 and interleaved over two slots in a manner that optimally divides each codeword between the two slots. At the receiver the coded Class 1 plus CRC bits, coded Class 2 bits, and Class 3 bits are extracted after de-interleaving.

12 Claims, 13 Drawing Sheets

| Cl1cw1[0] | Cl2cw1[0] | Cl1cw2[0] | Cl2cw2[0] | Cl1cw3[0] | Cl2cw3[0] | Cl1cw4[0] | Cl2cw4[0] |
| Cl1cw1[8] | Cl2cw1[6] | Cl1cw2[8] | Cl2cw2[6] | Cl1cw3[8] | Cl2cw3[6] | Cl1cw4[8] | Cl2cw4[6] |
| Cl1cw1[1] | Cl2cw1[1] | Cl1cw2[1] | Cl2cw2[1] | Cl1cw3[1] | Cl2cw3[1] | Cl1cw4[1] | Cl2cw4[1] |
| Cl1cw1[9] | Cl2cw1[7] | Cl1cw2[9] | Cl2cw2[7] | Cl1cw3[9] | Cl2cw3[7] | Cl1cw4[9] | Cl2cw4[7] |
| Cl1cw1[2] | Cl2cw1[2] | Cl1cw2[2] | Cl2cw2[2] | Cl1cw3[2] | Cl2cw3[2] | Cl1cw4[2] | Cl2cw4[2] |
| Cl1cw1[10] | Cl2cw1[8] | Cl1cw2[10] | Cl2cw2[8] | Cl1cw3[10] | Cl2cw3[8] | Cl1cw4[10] | Cl2cw4[8] |
| Cl1cw1[3] | Cl2cw1[3] | Cl1cw2[3] | Cl2cw2[3] | Cl1cw3[3] | Cl2cw3[3] | Cl1cw4[3] | Cl2cw4[3] |
| Cl1cw1[11] | Cl2cw1[9] | Cl1cw2[11] | Cl2cw2[9] | Cl1cw3[11] | Cl2cw3[9] | Cl1cw4[11] | Cl2cw4[9] |

FIG. 6A

| Cl1cw5[0] | Cl2cw5[0] | Cl1cw6[0] | Cl2cw6[0] | Cl3[12] | Cl3[28] | Cl3[44] | Cl3[60] | Cl3[76] |
| --- | --- | --- | --- | --- | --- | --- | --- | --- |
| Cl1cw5[8] | Cl2cw5[6] | Cl1cw6[8] | Cl2cw6[6] | Cl3[13] | Cl3[29] | Cl3[45] | Cl3[61] | Cl3[77] |
| Cl1cw5[1] | Cl2cw5[1] | Cl1cw6[1] | Cl2cw6[1] | Cl3[14] | Cl3[30] | Cl3[46] | Cl3[62] | Cl3[78] |
| Cl1cw5[9] | Cl2cw5[7] | Cl1cw6[9] | Cl2cw6[7] | Cl3[15] | Cl3[31] | Cl3[47] | Cl3[63] | Cl3[79] |
| Cl1cw5[2] | Cl2cw5[2] | Cl1cw6[2] | Cl2cw6[2] | Cl3[16] | Cl3[32] | Cl3[48] | Cl3[64] | |
| Cl1cw5[10] | Cl2cw5[8] | Cl1cw6[10] | Cl2cw6[8] | Cl3[17] | Cl3[33] | Cl3[49] | Cl3[65] | |
| Cl1cw5[3] | Cl2cw5[3] | Cl1cw6[3] | Cl2cw6[3] | Cl3[18] | Cl3[34] | Cl3[50] | Cl3[66] | |
| Cl1cw5[11] | Cl2cw5[9] | Cl1cw6[11] | Cl2cw6[9] | Cl3[19] | Cl3[35] | Cl3[51] | Cl3[67] | |

FIG.6B

| Cl1cw1[4] | Cl2cw1[4] | Cl1cw2[4] | Cl2cw2[4] | Cl1cw3[4] | Cl2cw3[4] | Cl1cw4[4] | Cl2cw4[4] |
| --- | --- | --- | --- | --- | --- | --- | --- |
| Cl1cw1[12] | Cl2cw1[10] | Cl1cw2[12] | Cl2cw2[10] | Cl1cw3[12] | Cl2cw3[10] | Cl1cw4[12] | Cl2cw4[10] |
| Cl1cw1[5] | Cl2cw1[5] | Cl1cw2[5] | Cl2cw2[5] | Cl1cw3[5] | Cl2cw3[5] | Cl1cw4[5] | Cl2cw4[5] |
| Cl1cw1[13] | Cl2cw1[11] | Cl1cw2[13] | Cl2cw2[11] | Cl1cw3[13] | Cl2cw3[11] | Cl1cw4[13] | Cl2cw4[11] |
| Cl1cw1[6] | Cl3[0] | Cl1cw2[6] | Cl3[2] | Cl1cw3[6] | Cl3[4] | Cl1cw4[6] | Cl3[6] |
| Cl1cw1[14] | Cl2cw1[12] | Cl1cw2[14] | Cl2cw2[12] | Cl1cw3[14] | Cl2cw3[12] | Cl1cw4[14] | Cl2cw4[12] |
| Cl1cw1[7] | Cl3[1] | Cl1cw2[7] | Cl3[3] | Cl1cw3[7] | Cl3[5] | Cl1cw4[7] | Cl3[7] |
| Cl1cw1[15] | Cl2cw1[13] | Cl1cw2[15] | Cl2cw2[13] | Cl1cw3[15] | Cl2cw3[13] | Cl1cw4[15] | Cl2cw4[13] |

FIG.6C

|   |   |   |   |   |   |   |   |
|---|---|---|---|---|---|---|---|
| Cl3 [68] | Cl3 [69] | Cl3 [70] | Cl3 [71] | Cl3 [72] | Cl3 [73] | Cl3 [74] | Cl3 [75] |
| Cl3 [52] | Cl3 [53] | Cl3 [54] | Cl3 [55] | Cl3 [56] | Cl3 [57] | Cl3 [58] | Cl3 [59] |
| Cl3 [36] | Cl3 [37] | Cl3 [38] | Cl3 [39] | Cl3 [40] | Cl3 [41] | Cl3 [42] | Cl3 [43] |
| Cl3 [20] | Cl3 [21] | Cl3 [22] | Cl3 [23] | Cl3 [24] | Cl3 [25] | Cl3 [26] | Cl3 [27] |
| Cl2cw6 [4] | Cl2cw6 [11] | Cl2cw6 [5] | Cl2cw6 [12] | Cl3 [10] | Cl2cw6 [13] | Cl3 [11] | Cl2cw6 [14] |
| Cl1cw6 [4] | Cl1cw6 [12] | Cl1cw6 [5] | Cl1cw6 [13] | Cl1cw6 [6] | Cl1cw6 [14] | Cl1cw6 [7] | Cl1cw6 [15] |
| Cl2cw5 [4] | Cl2cw5 [10] | Cl2cw5 [5] | Cl2cw5 [11] | Cl3 [8] | Cl2cw5 [12] | Cl3 [9] | Cl2cw5 [13] |
| Cl1cw5 [4] | Cl1cw5 [12] | Cl1cw5 [5] | Cl1cw5 [13] | Cl1cw5 [6] | Cl1cw5 [14] | Cl1cw5 [7] | Cl1cw5 [15] |

FIG.6D

HIGH PERFORMANCE ERROR CONTROL CODING IN CHANNEL ENCODERS AND DECODERS

This is a continuation of application Ser. No. 08/119,778, filed Sep. 10, 1993.

BACKGROUND OF THE INVENTION

1. Field of the Invention

The present invention generally relates to digital communications systems and, more particularly, to a high performance error control coding scheme for channel encoders and decoders that adds redundancy to the data prior to transmission and then decodes the data upon reception in a selective fashion. Such devices for error protection of data are commonly referred to as "channel codecs" for channel coding and channel decoding. The invention has particular application in digital cellular networks but may be advantageously used in any product line that employ low rate voice codecs and require error control for compressed speech data.

2. Description of the Prior Art

Cellular telecommunications systems are evolving from their current analog frequency modulated (FM) form towards digital systems. The Telecommunication Industry Association (TIA) has adopted a standard that uses a full rate 8.0 Kbps Vector Sum Excited Linear Prediction (VSELP) speech coder, convolutional coding for error protection, differential quadrature phase shift keying (QPSK) modulation, and a time division, multiple access (TDMA) scheme employing a 40 ms frame subdivided into six time slots per carrier frequency. The full rate standard occupies two time slots per 40 ms and is thus expected to triple the traffic carrying capacity of the cellular systems.

In order to further increase its capacity by a factor of two, the TIA has begun the process of evaluating and subsequently selecting a half rate speech and channel codec that would only require one time slot per 40 ms. For the purposes of the TIA half rate codec selection, the half rate speech plus channel codec should have an overall bit rate of 6.5 Kbps and is restricted to a frame size of 40 ms. The half rate speech plus channel codec is expected to have a voice quality comparable to the full rate standard over a wide variety of conditions. These conditions include various speakers, influence of handsets, background noise conditions, and channel conditions.

The error protection scheme used in the full rate standard utilizes the well known half rate convolutional channel encoder. The half rate convolutional channel encoder adds redundancy to the compressed speech data by using a shift register, generating two output bits for every input bit, and multiplexing the output bits to form the output. The generation of each output bit is done by a weighted modulo 2 sum of the input bit and the shift register contents according to a predefined generator polynomial. The number of memory elements in the shift register plus one is referred to as the constraint length of the convolutional coder. In the case of the full rate standard, there is a constraint length of six or five memory elements. The initial state of the shift register is zeroed out, and the final state is also guaranteed to be zero by flushing it with five tail or flush bits of "0" after every input block of compressed speech data.

The VSELP speech codec puts out 159 compressed speech bits every 20 ms. These bits are divided into two classes. Class 1 bits are bits that are perceptually more significant and therefore require error protection. This is accomplished by the half rate convolutional channel codec with constraint length 6. Class 2 bits are bits that are not as significant as their Class 1 counterparts and are given no error protection. There are 77 Class 1 bits and 82 Class 2 bits. Among the Class 1 bits, there are a few bits that are perceptually the most significant, and it is important that they have error detection capability as well. This is accomplished by using a 7-bit cyclic redundancy check (CRC) over the twelve most perceptually significant bits. The 77 Class 1 bits, the 7 CRC bits, and the 5 tail bits are fed into the convolutional encoder to generate 178 coded bits. These are then fed along with the Class 2 bits into an interleaving array of dimension 26×10, interleaved row-wise with the interleaving array of the previous 20 ms frame, and transmitted row-wise after interleaving.

At the receiving station, de-interleaving is first accomplished to yield the 26×10 array of coded Class 1 and Class 2 bits of the previous 20 ms VSELP frame. After extracting the 178 coded Class 1 bits, the 77 Class 1 bits and 7 CRC bits are decoded using the Viterbi algorithm, which is a special case of dynamic programming. The locally generated 7 CRC bits are compared to the received 7 CRC bits to provide a bad frame indication to the VSELP speech decoder.

The half rate speech plus channel codec is expected to perform as well as the full rate standard over a variety of channel conditions up to and including 3% bit error rate (BER) at a vehicle speed of 5 mph. The half rate speech codec compressed data carries the same information in approximately half the number of bits per second. As a result, it can be expected to be more sensitive to bit errors on the average. The half rate channel codec would therefore have to provide a greater degree of error protection despite the lower bit rate than the full rate channel codec. This can only be accomplished by a channel codec with a higher degree of error correction capability and which is better tailored to correct the kind of error patterns representative of a Rayleigh fading channel. The convolutional channel codec used in the full rate standard is not tailored in any way to correct transmission errors due to a Rayleigh fading channel. Its error correcting capacity can be increased by increasing its constraint length, but this comes with an exponential increase in cost or complexity of the Viterbi decoder. Generalized Viterbi decoding techniques suffer from the same disadvantages.

Among alternative channel codecs that could be considered for this are short block codes. Such channel codecs also utilize maximum likelihood techniques using soft decision like the convolutional channel decoder. In addition, such channel codecs offer the following additional advantages:

1. No overhead due to flush bits.
2. The codeword generator matrix can be optimized to reduce the average number of bits in error for a given codeword error rate.
3. The interleaver can be optimized for the given fading channel.
4. Generalized decoding can be used to further reduce error rate and bit error rate with little extra cost.

The error correcting power of such block codes is a function of their minimum Hamming distance. Typically, longer block codes possess a larger minimum Hamming distance, but the cost of decoding such block codes also increases with its length, as does the complexity of decoding such block codes. The rate ½ nonlinear block code (NBC) discovered by Nordstrom and Robinson (A. W. Nordstrom and J. P. Robinson, *Information and Control*, November- –December 1967, pp. 613–161) of length 16 and minimum Hamming distance 6 appears to be an ideal compromise and has the additional advantage that one can simplify the maximum likelihood decoding using a fast Hadamard transform based method.

The NBC code has been known over two decades. This code is optimal in terms of having the largest number of codewords possible for the given Hamming distance. Despite its optimality, this code has not received much attention in engineering circles because it is nonlinear. Recent results have shown that the NBC code is in fact linear when considered as quaternary (alphabet {0,1,2,3}) codes. As a result, all linear techniques can now be applied to the NBC.

SUMMARY OF THE INVENTION

It is an object of the present invention to provide improvements in error control coding schemes for low bit rate speech coders in order to improve their performance in the presence of transmission errors typical of the digital cellular channel.

According to the invention, an error control coding scheme exploits the newly discovered linear characteristics of nonlinear block codes (NBCs) for purposes of tailoring the NBC to the fading channel in order to provide superior error protection to the compressed half rate speech data. In the description of the preferred embodiment of the invention, the half rate speech codec is assumed to have a frame size of 40 ms. The speech encoder puts out a fixed number of bits per 40 ms. These bits are divided into three distinct classes, referred to as Class 1, Class 2 and Class 3 bits. A subset of the Class 1 bits are further protected by a CRC for error detection purposes. The Class 1 bits and the CRC bits are encoded by a rate ½ Nordstrom Robinson code with codeword length of 16. The Class 2 bits are encoded by a punctured version of the Nordstrom Robinson code. It has an effective rate of 8/14 with a codeword length 14. The Class 3 bits are left unprotected. The coded Class 1 plus CRC bits, coded Class 2 bits, and the Class 3 bits are mixed in an interleaving array of size 16×17 and interleaved over two slots in a manner that optimally divides each codeword between the two slots. At the receiver the coded Class 1 plus CRC bits, coded Class 2 bits, and Class 3 bits are extracted after de-interleaving. Maximum likelihood techniques using soft decision are employed to decode the Class 1 plus CRC bits as well as the Class 2 bits. The CRC is also used to further reduce the bit error rate (BER) of the subset of Class 1 bits over which it was applied by using generalized decoding techniques. In addition to the CRC based bad frame indication flag, raw channel bit error rate estimates for each codeword are also sent to the speech decoder as well.

BRIEF DESCRIPTION OF THE DRAWINGS

The foregoing and other objects, aspects and advantages will be better understood from the following detailed description of a preferred embodiment of the invention with reference to the drawings, in which:

FIGS. 6, 6a, 6b, 6c and 6d disclose a graphical illustration of the distribution of coded Class 1 plus CRC bits, coded Class 2 bits, and Class 3 bits in the 16×17 interleaving array;

DETAILED DESCRIPTION OF A PREFERRED EMBODIMENT OF THE INVENTION

Figure 1:
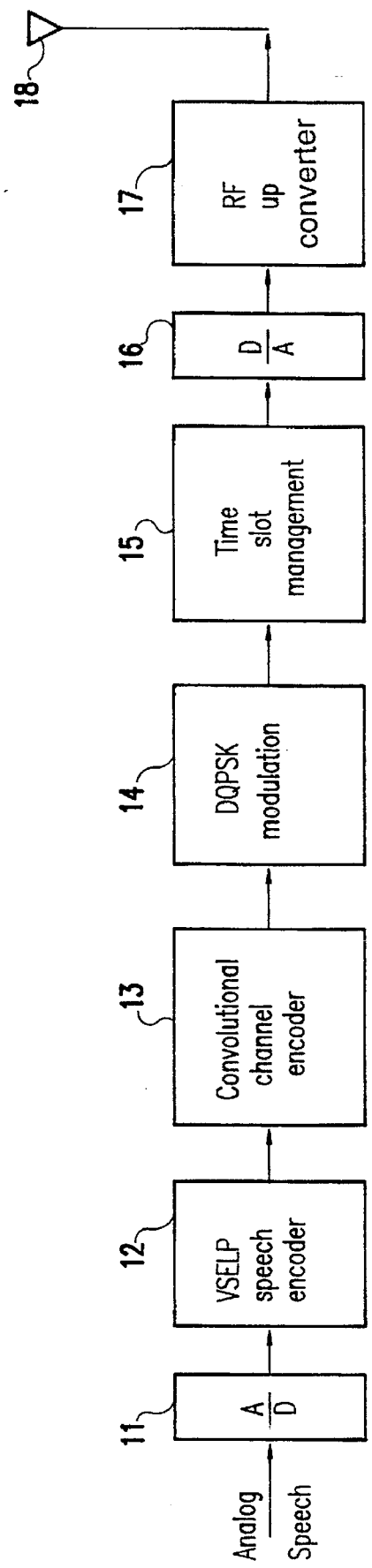
FIG. 1 is a block diagram of the baseband portion of the transmitting section of the full rate TDMA digital cellular system employing a channel encoder.

By way of introduction, the full rate TDMA digital cellular system will be first described, followed by a description of the invention as applied to a specific half rate codec. Referring now to the drawings, and more particularly to FIG. 1, there is shown the baseband portion of the transmitting section of a digital cellular system. Analog speech, from a suitable handset, is sampled at an 8 Khz rate and converted to digital values by analog-to-digital (A/D) converter 11 and supplied to a VSELP speech encoder 12. The encoded speech is further encoded by convolutional channel encoder 13, and the resulting encoded bit stream is supplied to a DQPSK modulator 14. The output of the modulator 14 is assigned to one of plural time slots by time slot management circuitry 15 and convened by a digital-to-analog (D/A) converter 16 to the QPSK signals that are amplified and frequency multiplied by radio frequency (RF) up converter 17 and radiated by antenna 18.

Figure 2:
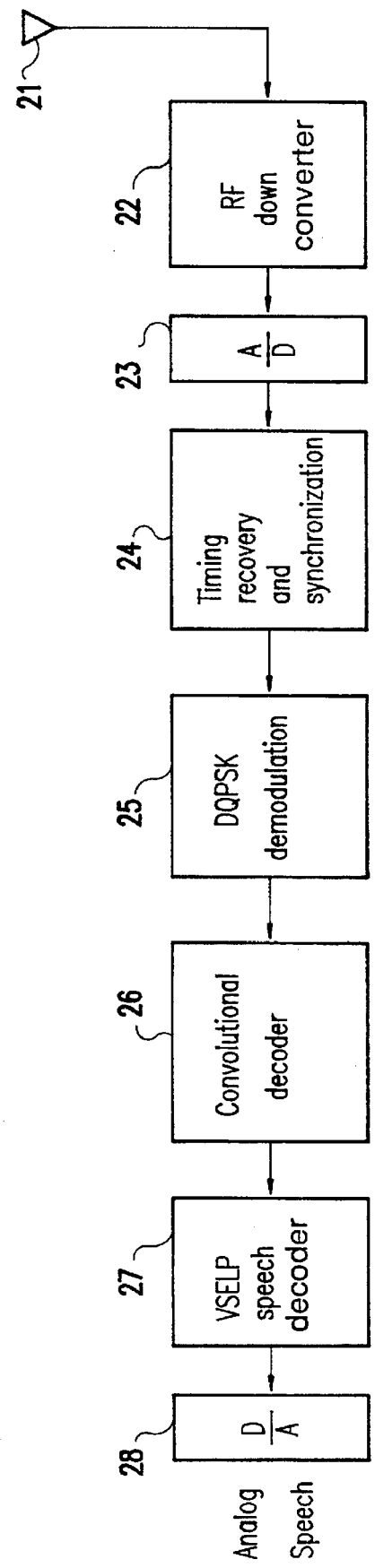
FIG. 2 is a block diagram of the baseband portion of the receiving section of the full rate TDMA digital cellular system employing a channel decoder.

In FIG. 2, the transmitted signal is received by antenna 21 and heterodyned to an intermediate frequency (IF) by RF down converter 22. The IF signal is convened to a digital bit stream by an A/D converter 23, and the resulting bit stream is supplied to timing recovery and synchronization circuitry 24. The bit stream is then demodulated in DQPSK demodulator 25. At this point the reverse of the encoding process in the transmitter takes place. Specifically, decoding is performed by channel convolutional decoder 26 and the VSELP speech decoder 27. Finally, the output of the speech decoder is supplied to the D/A converter 28 having an 8 Khz sampling rate to synthesize analog speech.

Figure 3:
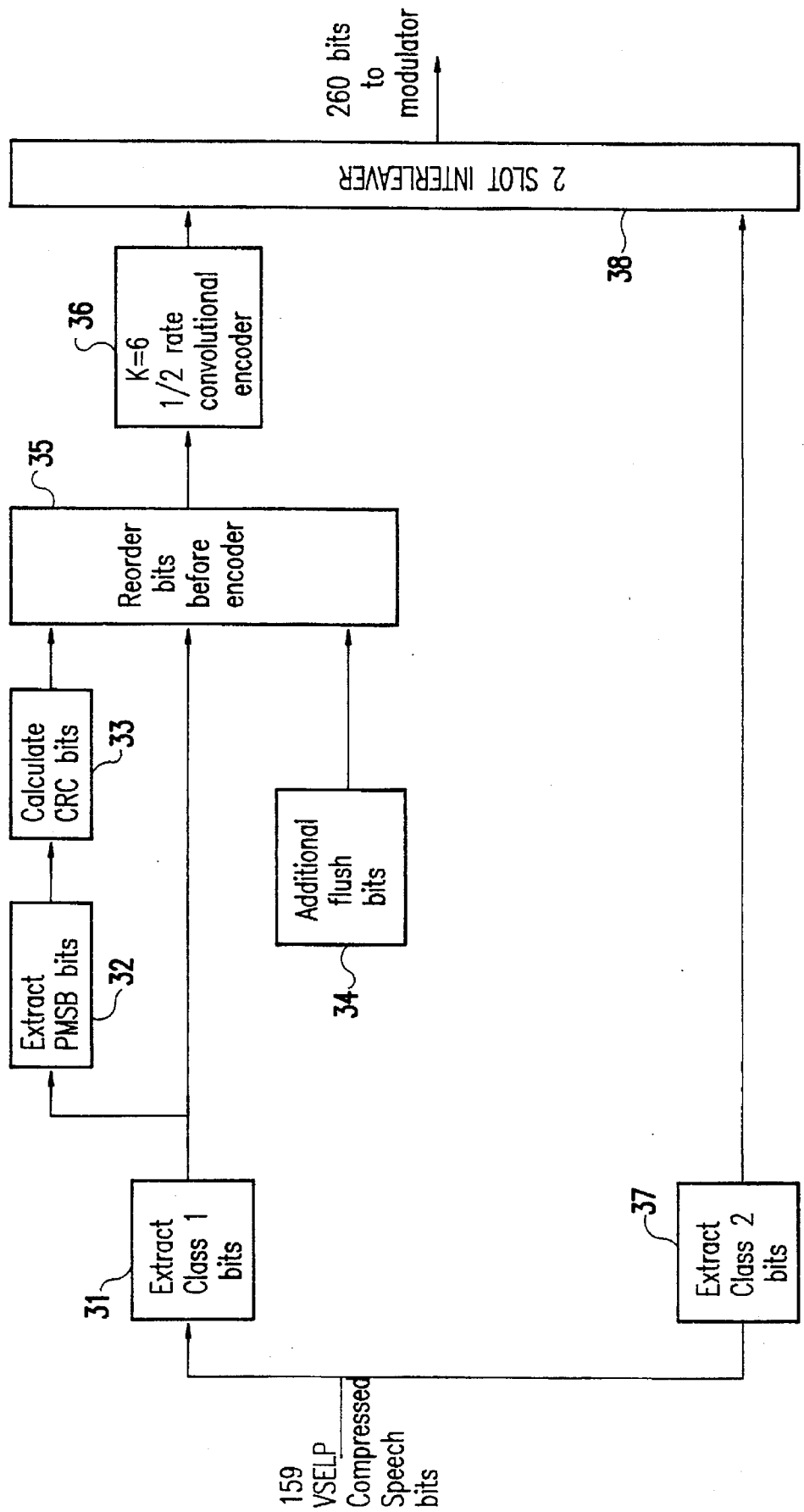
FIG. 3 is a block diagram of the channel encoder based on convolutional encoding used in the full rate standard.

The convolutional channel encoder 13 shown in FIG. 1 as used in the full rate standard is shown in FIG. 3 receives 159 VSELP compressed speech bits and divides these bits into two classes, 77 Class 1 bits and 82 Class 2 bits. The Class 1 bits are extracted at 31. Among the Class 1 bits, there are a few bits that are perceptually the most significant (PMSB), and these are extracted at 32 and provided with error detection capability using a 7-bit cyclic redundancy check (CRC) over the twelve most perceptually significant bits by CRC calculation 33. The remaining Class 1 bits and additional flush bits generated at 34 are reordered at 35 and supplied to convolutional encoder 36. The Class 2 bits are extracted at 37 and are supplied unprotected to a two slot interleaver 38 where they are interleaved with the output of convolutional encoder 36.

Figure 4:
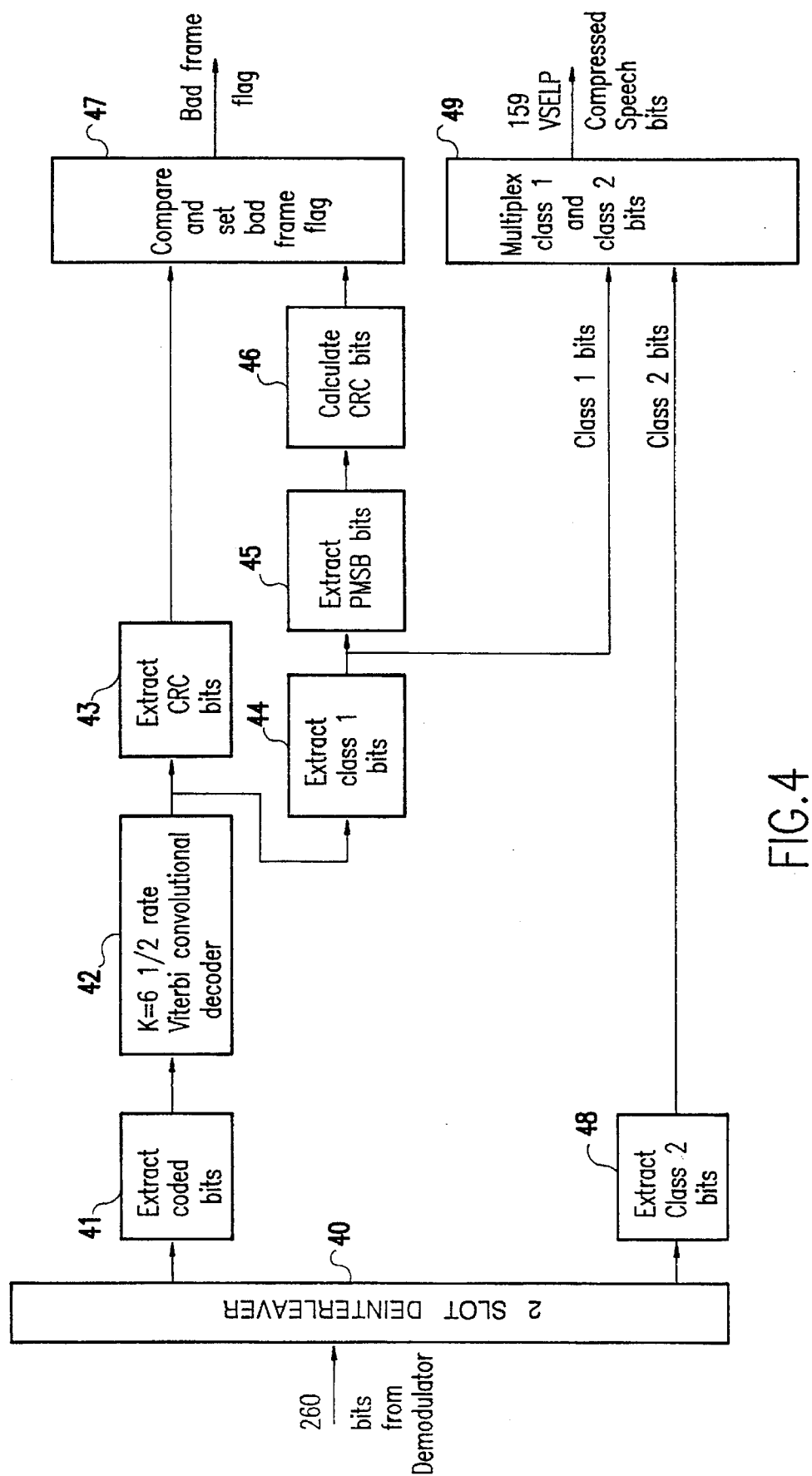
FIG. 4 is a block diagram of the channel decoder based on convolutional Viterbi decoding used in the full rate standard.

The channel decoder 26 of FIG. 2 as used in the full rate standard is shown in FIG. 4 and includes a two slot deinterleaver 40 which performs the reverse process to the interleaver 38. The coded bits are extracted at 41 and supplied to a Viterbi convolutional decoder 42. From the decoded bits, the CRC bits are extracted at 43 and the Class 1 bits are extracted at 44. From the extracted Class 1 bits, the PMSB bits are extracted at 45 and the CRC bits are calculated at 46. The calculated CRC bits are compared with the extracted CRC bits in comparator 47. If the two do not compare, a bad frame flag is set. The Class 1 bits extracted at 44 and the Class 2 bits extracted at 48 are combined in multiplexer 49 to generate the 159 VSELP compressed speech bits.

We now turn our attention to the half-rate channel encoder which is under consideration by the TIA standard body. Such a half rate channel requires the use of low rate speech and channel codecs that together only utilize 6.5 Kbps. The compressed speech bits of any low rate codec need to be split into many classes that require different degrees of protection. This is done off line and is specific to the low rate codec in question. This process of categorization of these compressed speech bits into various classes is based on a combination of A-factor analysis and informal listening tests. The effects of transmission errors on each bit of the speech encoder output can be studied by studying the drop in well defined "performance measure" when that bit is repeatedly forced to be in error. This drop in "performance" is expressed relative to the clean channel "performance" in dB and is referred to as the associated A-factor for that particular bit. The more sensitive bits have very large drop in "performance" and hence have large A-factors. Unfortunately, for low bit rate voice coders, well defined "performance measures" are subjective measures that are too expensive to measure. A compromise is to use an objective performance measure and combine it with selective informal listening tests. One such measure is the segmental signal to noise ratio (SNR). With this measure, one can prioritize bits of the same parameter accurately. But comparison across parameters using this objective performance measure would be difficult. Thus, one can use these segmental SNR based A-factors for prioritizing all bits belonging to a certain parameter type, such as short term predictors, for the entire frame but comparisons between bits of different parameter types, such as between short term predictor bits and gain bits, would be misleading. We therefore use informal listening of a large speech utterance to judge an A-factor threshold for each parameter type. Those above this threshold can be grouped into one class, while those below are grouped into a second class. Further categorization can be accomplished in a similar fashion to yield a multiplicity of classes.

Figure 5:
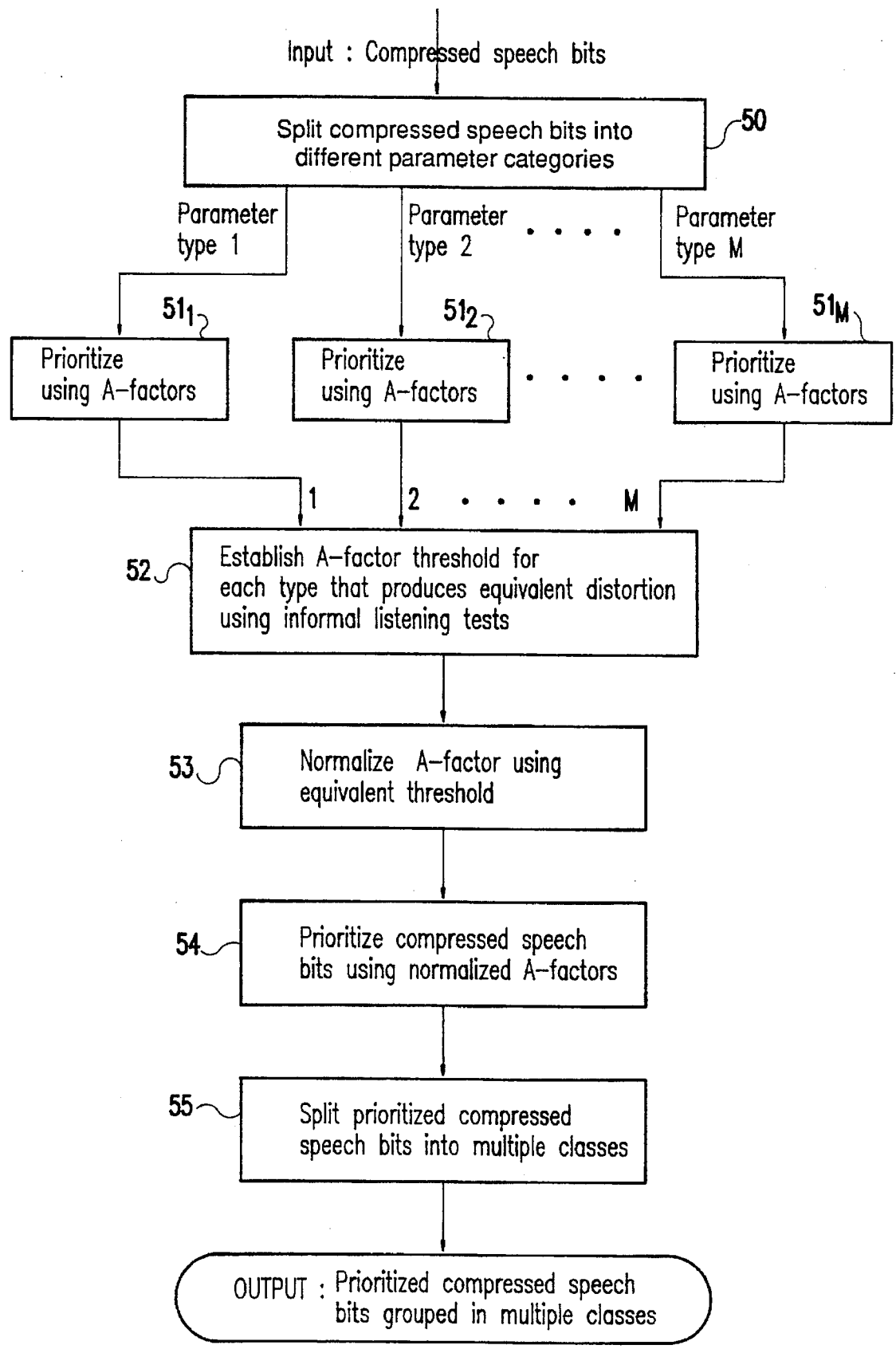
FIG. 5 is a flowchart of the process used to split the compressed speech bits into multiple classes.
Figure 6:
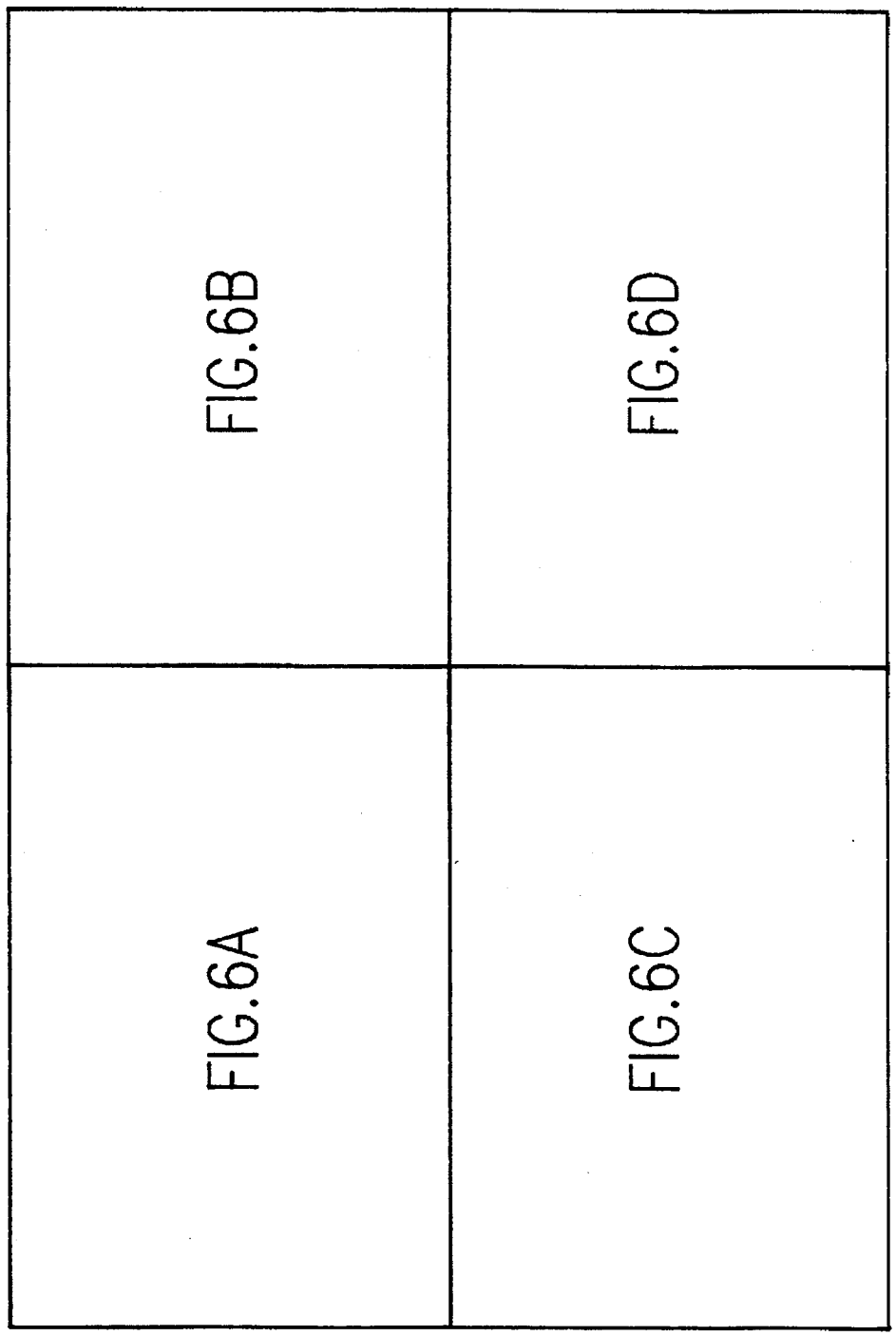

A flowchart describing this process of splitting compressed speech bits into multiple classes is illustrated in FIG. 5. The compressed speech bits are split into different parameter categories in the first step 50. Each parameter category is prioritized using A-factors in processes $51_1, 51_2, \ldots 51_M$. A-factor thresholds are established in step 52 for each type that produces equivalent distortion using informal listening tests. These A-factors are normalized in step 53 using equivalent thresholds, and then in step 54, compressed speech bits are prioritized using normalized A-factors. The prioritized compressed speech bits are split into multiple classes in step 55 to generate as the output prioritized compressed speech bits grouped in multiple classes.

The half rate speech coder used in the preferred embodiment of the invention has a frame size of 40 ms and a bit rate of 4.2 Kbps. Every frame, the compressed speech data consists of 168 bits. These bits are not all of equal importance from a perceptual stand point and, therefore, require different levels of protection. The subject invention outputs 168 bits which are divided into three classes using the process defined above:

40 Class 1 bits
48 Class 2 bits
80 Class 3 bits

The 40 Class 1 bits are the most important compressed speech bits in the sense that they are most vulnerable to transmission impairment. Among these 40 bits are 24 bits denoted as the perceptually most significant bits (PSMBs) that require error detection as well. These PSMBs are isolated using the procedure to prioritize bits within each class outlined above. The error detection capability is provided for by applying an 8-bit CRC with generator polynomial $1+x^2+x^7+x^8$ to the 24 PMSBs. The 8 CRC bits and the 40 Class 1 bits are provided the maximum error protection.

The 48 Class 2 bits are less important than the Class 1 bits but still require error protection. Finally, the 80 Class 3 bits are left unprotected. Table 1 lists the allocation of bits prior to and after coding.

TABLE 1

BIT ALLOCATION AMONG VARIOUS CLASSES.

| Category | # bits | # CRC bits | Rate | # coded bits |
|---|---|---|---|---|
| Class 1 | 40 | 8 | 8/16 | 96 |
| Class 2 | 48 | 0 | 8/14 | 84 |
| Class 3 | 80 | 0 | 1 | 80 |
| Total | 168 | 8 | — | 260 |

The 40 Class 1 and 8 CRC bits are provided the maximum protection using the Nordstrom Robinson (16,8,6) code. Here, 16 refers to the codeword length, 8 refers to the message word length, and 6 denotes the minimum Hamming distance of the code. The 40 Class 1 and 8 CRC bits are packed as 6 message words of length 8 each, and each message word is then coded independently to produce six codewords, each of length 16. The 24 PMSBs and 8 CRC bits are distributed among four message words with 2 CRC bits and 6 PMSBs per message word. The distribution of PMSBs among these four message words is done in a way that the average importance per codeword (using the normalized measure to prioritize all bits in each class) is approximately the same. The remaining 16 Class 1 bits are grouped into two message words in the same manner. The encoding process first transforms each 8-bit long message vector into four quaternary symbols by applying the mapping of Table 2 to every pair of adjacent bits in the input message vector.

TABLE 2

MAPPING A BIT PAIR
TO QUATERNARY SYMBOL

| Bit pair | Quaternary symbol |
|---|---|
| 00 | 0 |
| 01 | 3 |
| 10 | 1 |
| 11 | 2 |

The quaternary symbols are elements of the alphabet {0,1, 2,3} and are essentially the ring on integers modulo 4. Multiplication and addition with these symbols are carried out using modulo 4 arithmetic. The NBC code is a linear code when interpreted as a Quaternary code. One can then define the encoding process in terms of a generator matrix defined as $$G = \begin{matrix} 1 & 0 & 0 & 0 & 3 & 1 & 2 & 1 \\ 0 & 1 & 0 & 0 & 1 & 2 & 3 & 1 \\ 0 & 0 & 1 & 0 & 3 & 3 & 3 & 2 \\ 0 & 0 & 0 & 1 & 2 & 3 & 1 & 1 \end{matrix}$$

If we represent the message vector m in terms of its quaternary symbol elements as $m = [m_0 \ m_1 \ m_2 \ m_3]$, then the encoding process can simply be described as multiplying the message vector m by the generation matrix G, i.e., $c = [c_0 \ c_1 \ \ldots \ c_6 \ c_7] = m \cdot G$. As noted before, all operations are carried out using modulo 4 arithmetic. The codeword quaternary symbols are transformed back to bit pairs using Table 2. Note that the generator matrix is a systematic one and as a result $c_0 = m_0$, $c_1 = m_1$, $c_2 = m_2$, $c_3 = m_3$, so only $c_4$, $c_5$, $c_6$, $c_7$ need to be computed. The selection of the generator matrix is done so that the average number of bits in error for an erroneous codeword is kept to a minimum for the worst channel condition of interest, i.e., 3% BER at a vehicle speed of 5 mph. The generator matrix describe here does that and produces on the average three bits in error for every erroneous codeword for the worst channel condition of interest.

The Class 2 bits are encoded using a punctured version of the basic Nordstrom Robinson code and has an effective rate 8/14. The punctured code converts a message word of length 8 to a codeword of length 14. The 48 Class 2 bits are grouped into six message words in the same manner as Class 1 bits. The 8-bit long message words are transformed into four quaternary symbol vectors using the mapping in Table 2. The encoding process uses the same generator matrix defined as before but with the last column removed; i.e., $$G' = \begin{matrix} 1 & 0 & 0 & 0 & 3 & 1 & 2 \\ 0 & 1 & 0 & 0 & 1 & 2 & 3 \\ 0 & 0 & 1 & 0 & 3 & 3 & 3 \\ 0 & 0 & 0 & 1 & 2 & 3 & 1 \end{matrix}$$

The above generator matrix also produces the minimum average number of bits in error for an erroneous codeword for the worst channel condition of interest. This minimum average number is 1.8 bits. The seven symbol long message vector is obtained by multiplying the message vector by the modified generator matrix G'. The seven symbol long codeword is then converted to a 14-bit codeword using the mapping in Table 2.

FIGS. 6, 6a, 6b, 6c and 6d illustrate the distribution of the coded Class 1 plus CRC bits, coded Class 2 bits, and 3 Class bits in the 16×17 interleaving array. The coded Class 1 plus CRC bits, coded Class 2 bits, and Class 3 bits are fed into a 16×17 interleaving array. The Class 1 codewords occupy columns 1, 3, 5, 7, 9, and 11, respectively. The Class 2 codewords occupy columns 2, 4, 6, 8, 10, and 12, respectively. The Class 3 bits occupy the remaining two unfilled positions in each of the Class 2 codeword columns as well as columns 13, 14, 15, 16 and the first four rows of column 17. Interleaving over two slots is accomplished by transmitting the even rows 2, 4, 6, 8, 10, 12, 14, 16 of the present interleaving array and the odd rows 1, 3, 5, 7, 9, 11, 13, 15 of the previous interleaving array. In order to minimize the codeword error rate for Class 1 codewords for the worst case channel condition of 3% BER at 5 mph, an optimum division of the coded quaternary symbols between the transmissions in the two time slots is needed. Based on our investigations, this is accomplished by transmission of quaternary symbols of each Class 1 codeword $c_0$, $c_1$, $c_2$, $c_3$ in one time slot and the remaining $c_4$, $c_5$, $c_6$, $c_7$ in the other time slot. Thus the $c_0$ bits occupy rows 1 and 3, the $c_1$ bits occupy rows 5 and 7, the $c_2$ bits occupy rows 9 and 11, the $c_3$ bits occupy rows 13 and 15, the $c_4$ bits occupy rows 2 and 4, the $c_5$ bits occupy rows 6 and 8, the $c_6$ bits occupy rows 10 and 12, and the $c_7$ bits occupy rows 14 and 16. Similarly, for the Class 2 codewords, the codeword error rate is minimized for the worst channel condition of interest by transmitting quaternary symbols of each Class 2 codeword $c_0$, $c_1$, $c_2$ in one time slot and the remaining $c_3$, $c_4$, $c_5$, $c_6$ in the other time slot. Thus, the $c_0$ bits occupy rows 1 and 3, the $c_1$ bits occupy rows 5 and 7, the $c_2$ bits occupy rows 9 and 11, the $c_3$ bits occupy rows 2 and 4, the $c_4$ bits occupy rows 6 and 8, the $c_5$ bits occupy rows 10 and 12, and the $c_6$ bits occupy rows 14 and 16. The Class 3 bits typically consist of codebook indices and least significant bits of other parameter types. The bits corresponding to these codebook indices are distributed in such a way that a given codebook index is completely transmitted in one time slot, but the codebook index corresponding to the adjacent subframe or subblock of speech is transmitted in the other time slot.

Figure 7:
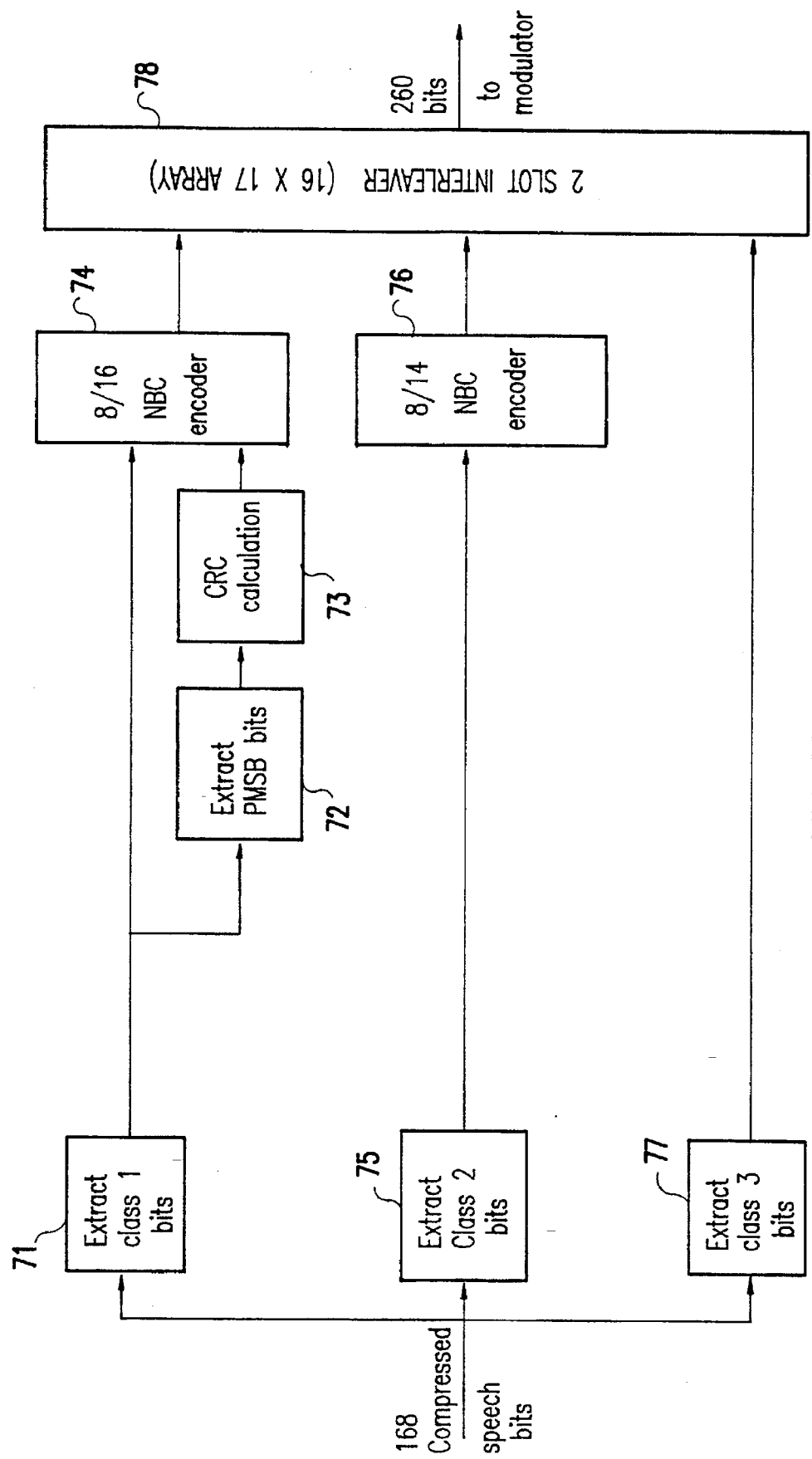
FIG. 7 is a block diagram of the channel encoder based on the NBC code used in the preferred embodiment of the invention.

FIG. 7 is a functional block diagram of the channel encoder. The 168 compressed speech bits are extracted into Class 1, Class 2 and Class 3 bits. From the Class 1 bits extracted at 71, PMSB bits are extracted at 72 and provided to CRC calculation 73. The output of the CRC calculation 73 and the remaining Class 1 bits are encoded by an 8/16 NBC encoder 74. The Class 2 bits extracted at 75 are encoded by an 8/14 NBC encoder 76. The outputs of encoders 74 and 76 and the Class 3 bits extracted at 77 are supplied to a two slot interleaver 78, in the form of the 16×17 array shown in FIG. 6, to generate 260 bits to the modulator.

Figure 8:
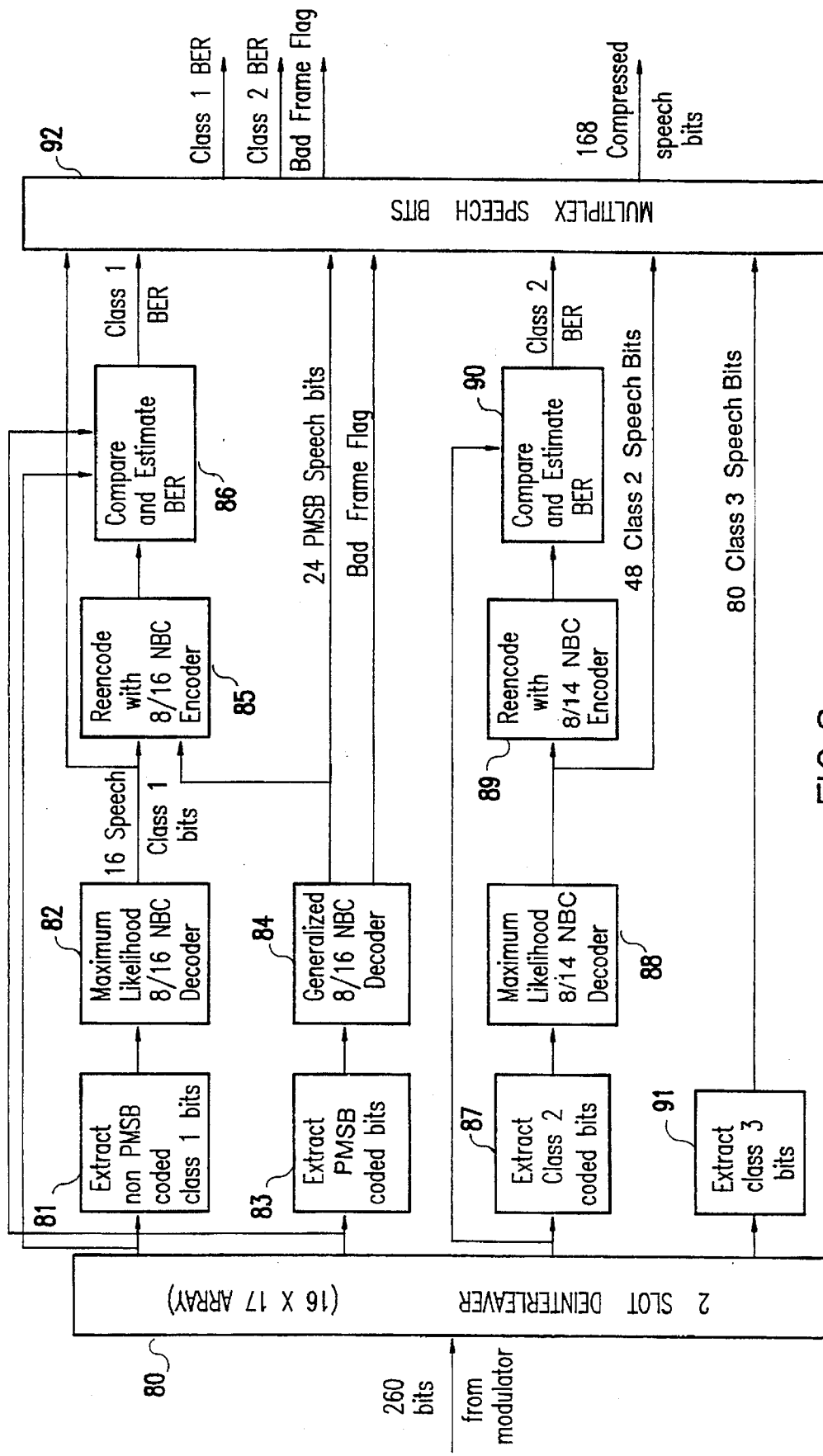
FIG. 8 is a block diagram of the complete channel decoder used in the preferred embodiment of the invention.

The channel decoder shown in FIG. 8 receives soft decision values corresponding to each of the 260 bits from the demodulator. These soft decision values typically are related to the quantized value of the square of the differentially demodulated fade amplitude. In the TIA half rate codec test, fourteen bits of precision were used to represent the magnitude of the soft decision value, but it must be understood that the channel decoder described below could be used with any soft decision or hard decision representation.

The first step in the channel decoding process is deinterleaving, the inverse process of interleaving. The received 260 soft decision values are fed into a 16×17 array 80, and the even rows of the old array and the odd rows of the present array are combined to reproduce the intermixed array of FIG. 6 corresponding to the previous speech frame. From this array, the soft decision values corresponding to the coded Class 1 plus CRC bits, coded Class 2 bits, and the Class 3 bits of the previous speech frame can be extracted. Since the Class 3 bits are uncoded, only their hard decision values need be retained.

In order to decode any PMSB codeword, the correlation between the received soft decision values corresponding to that codeword and each of the 256 possible codewords is calculated. Non-PMSB coded Class 1 bits are extracted at 81 and supplied to a maximum likelihood 8/16 NBC decoder 82 which outputs sixteen Class 1 speech bits. The maximum likelihood or best candidate is that codeword which produces the maximum correlation. The second best candidate is the codeword which produces the second highest correlation, and so on. The N best candidates can thus be listed by noting the codewords with the N highest correlations.

The PMSB coded bits are extracted at 83 and supplied to a generalized 8/16 NBC decoder 84 which outputs twenty-four PMSB speech bits. For the four PMSB codewords, $4^N$ possible combinations of codewords can be listed. Generalized decoding using the CRC can then be realized by looking for that combination for which the locally generated CRC bits coincides with the received CRC bits. If no such combination is found, a bad frame indication flag is set, and the four PSMB codewords are just set to be the maximum likelihood candidates.

Generalized decoding helps reduce the bad frame error rate but comes at the expense of false alarm rate which occurs when a bad frame indication is incorrectly provided or not provided. In order to strike a compromise between the reduction of the bad frame error rate and the false alarm rate, only a subset of $4^N$ combinations are used in the generalized decoding of the PMSB codewords. In the preferred embodiment of the invention, N is set to three, but instead of using all $4^3$ or 64 combinations in the generalized decoding, only a subset of twenty combinations are utilized. Thus, the $j_1$-th best candidate for the first PMSB codeword, the $j_2$-th best candidate for the second PMSB codeword, the $j_3$-th best candidate for the third PMSB codeword, and the $j_4$-th best candidate for the fourth PMSB codeword are utilized in the generalized decoding only for the following combinations:

TABLE 3

COMBINATIONS USED
IN GENERALIZED DECODING

| $j_1$ | $j_2$ | $j_3$ | $j_4$ |
|---|---|---|---|
| 1 | 1 | 1 | 1 |
| 1 | 1 | 1 | 2 |
| 1 | 1 | 2 | 1 |
| 1 | 1 | 2 | 2 |
| 1 | 2 | 1 | 1 |
| 1 | 2 | 1 | 2 |
| 1 | 2 | 2 | 1 |
| 1 | 2 | 2 | 2 |
| 2 | 1 | 1 | 1 |
| 2 | 1 | 1 | 2 |
| 2 | 1 | 2 | 1 |
| 2 | 1 | 2 | 2 |
| 2 | 2 | 1 | 1 |
| 2 | 2 | 1 | 2 |
| 2 | 2 | 2 | 1 |
| 2 | 2 | 2 | 2 |
| 3 | 1 | 1 | 1 |
| 1 | 3 | 1 | 1 |
| 1 | 1 | 3 | 1 |
| 1 | 1 | 1 | 3 |

If for more than one combination the locally generated CRC equals the received CRC bits, then the combination is chosen for which $j_1+j_2+j_3+j_4$ is a minimum.

Figure 9:
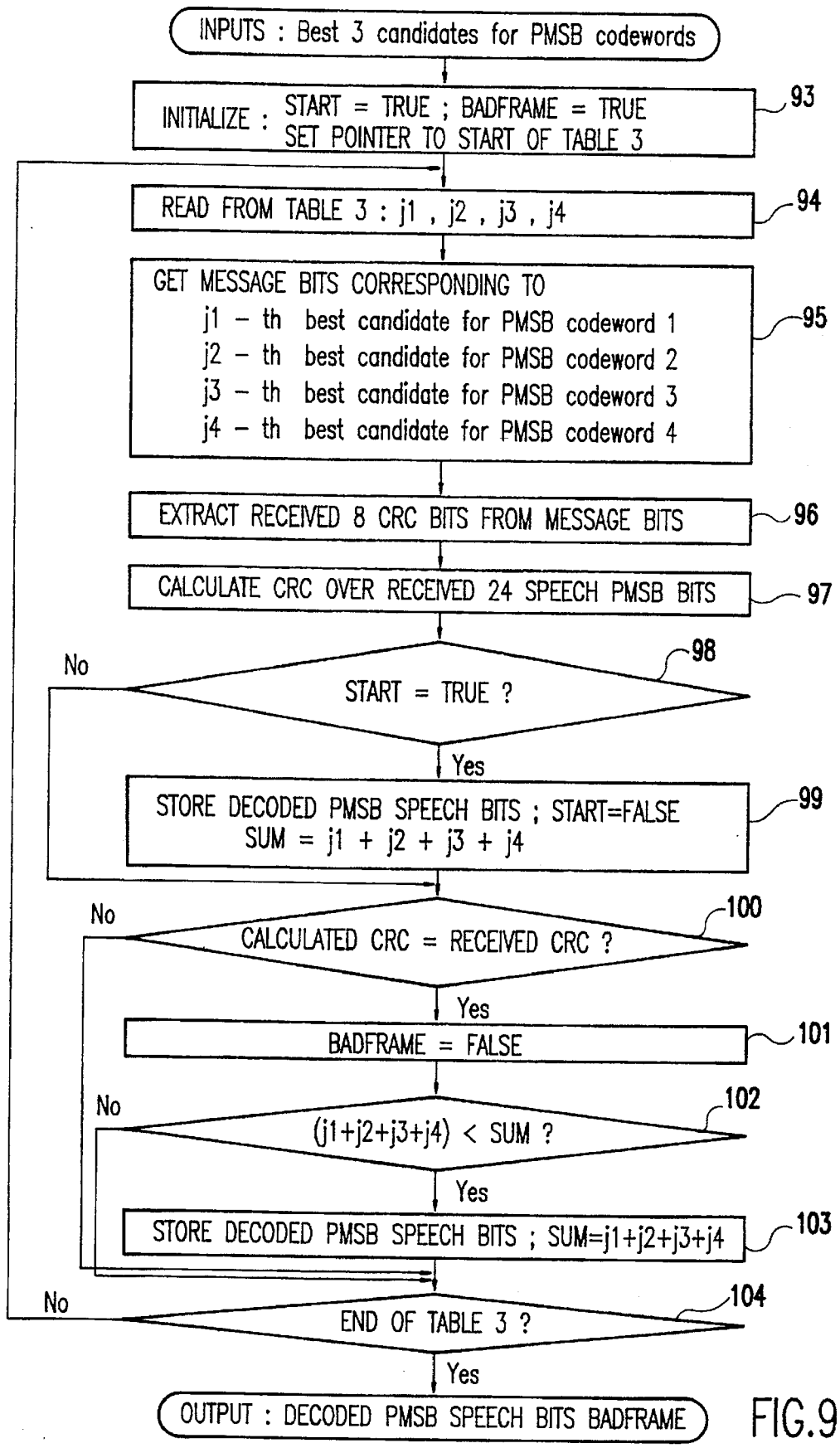
FIG. 9 is a flowchart showing the generalized decoding of the PMSB codewords in the preferred embodiment of the invention.

A flowchart describing the generalized decoding of the PMSB codewords in the preferred embodiment of the invention is shown in FIG. 9. The inputs to the process are the best three candidates for PMSB codewords. The process is first initialized at step 93, and then an iterative loop is entered. The first step 94 of the loop is to read j1+j2+j3+j4 from Table 3, then get the message bits corresponding to the best candidates for each of the PMSB codewords in step 95. The eight CRC bits are extracted in step 96, and in step 97, the CRC bits are calculated over the received PMSB bits. A test made in step 98 to determine if "START=TRUE". If so, the decoded PMSB speech bits are stored, START is set to FALSE, and SUM is set to equal j1+j2+j3+j4 in step 99; otherwise, this step is skipped. The extracted and calculated CRC bits are compared in step 100, and if they are equal, BADFRAME is set to FALSE in step 101. A test is made in step 102 to determine if j1+j2+j3+j4 is less than SUM. If so the decoded PMSB speech bits are stored and SUM is set to equal j1+j2+j3+j4 in step 103; otherwise, this step is skipped. At this point in the process, a test is made in decision block 104 to determine if the end of Table 3 has been reached. If not, the process loops back to step 94 for the next iteration.

For the other two Class 1 codewords, the decoding stops after determining the maximum likelihood estimate. The six Class 2 codewords are decoded similarly. More particularly, the Class 2 coded bits extracted at 87 are supplied to maximum likelihood 8/14 NBC decoder 88 which outputs 48 Class 2 speech bits. In addition, one may obtain an estimate of the raw channel BER experienced by any codeword by reencoding the corresponding decoded message bits and comparing it to the hard decision representation of the received codeword. The outputs of decoders 82 and 84 are reencoded by 8/16 NBC encoder 85 to generate an output which is compared at 86 with the deinterleaved coded Class 1 bits to generate an estimated Class 1 BER. The 48 Class 2 speech bits are reencoded with 8/14 NBC encoder 89 to generate an output which is compared at 90 with the deinterleaved Class 2 coded bits to generate an estimated Class 2 BER. Such a raw channel BER estimate may be averaged over all codewords, or just the PMSB codewords, or just the Class 1 codewords, or just the Class 2 codewords and then sent to the speech decoder where such information may be exploited to improve speech quality even in the presence of uncorrectable transmission errors.

The message bits corresponding to the decoded Class 1 and Class 2 codewords, the Class 3 bits, and the bad frame indication flag are multiplexed in multiplexer 92 to generate 168 compressed speech bits which are sent to the speech decoder.

The computation of the correlation term can be carried out using a fast Hadamard transform. The following is a description of the version of the fast algorithm used in the preferred embodiment of the invention.

First, the received demodulated vector is denoted as a complex vector $R=[R_0 R_1 \ldots R_7]$, where the complex elements $R_i$ are related to the soft decision values associated with the i-th quaternary symbol by $R_i=r_i+j\hat{r}_i$. The first step is to set up the complex diagonal matrix Q whose diagonal elements are obtained by rotating and conjugating the received vector as follows: $[Q_0 Q_1 \ldots Q_7]=R^*(1+j)$. Thus, each complex element $Q_i$ is related to the received soft decision values by $$Q_i = q_i + j\hat{q}_i = (r_i + \hat{r}_i) + j(r_i - \hat{r}_i).$$

In the second step, eight complex vectors $v_i$ for i=0 to i=7 are set up in terms of constant vectors $h_i$ as $v_i=h_i Q$. Here, the complex vectors hi are defined as:

$h_0 = [1\ 1\ 1\ 1\ 1\ 1\ 1\ 1]$ $h_1 = [1\ 1\ 1\ j\ -1\ -j\ j\ j]$ $h_2 = [1\ 1\ j\ 1\ -j\ -j\ -j\ -1]$ $h_3 = [1\ 1\ j\ j\ j\ -1\ 1\ -j]$ $h_4 = [1\ j\ 1\ 1\ j\ -1\ -j\ j]$ $h_5 = [1\ j\ 1\ j\ -j\ j\ 1\ -1]$ $h_6 = [1\ j\ j\ 1\ 1\ j\ -1\ -j]$ $h_7 = [1\ j\ j\ j\ -1\ 1\ -j\ 1]$

These constant complex vectors correspond to a mapping of eight codewords generated by message vectors whose first quaternary symbol element $m_0$ is restricted to zero and whose other elements $m_1$, $m_2$, $m_3$ are restricted to be zero or one. The eight codewords are mapped to the constant complex vectors using Table 4.

TABLE 4

MAPPING A QUATERNARY SYMBOL TO A COMPLEX VALUE

| Quaternary Symbol | Complex Value |
|---|---|
| 0 | 1 |
| 1 | j |
| 2 | −1 |
| 3 | −j |

In the third step, the inner product of the vectors $v_i$ are computed with eight constant complex vectors that correspond to a mapping in codewords generated by message vectors whose first quaternary symbol element $m_0$ is restricted to zero and whose other elements $m_1$, $m_2$, $m_3$ are restricted to be zero or two. This can be expressed as $\hat{w}_i^T = H_8 \hat{v}_i^T$, where $H_8$ is the 8×8 Sylvester type Hadamard matrix, and the vectors $\hat{v}_i$ and $\hat{w}_i$ are permuted versions of $v_i$ and $w_i$, respectively, i.e., $$\hat{v}_i = [v_{i0}\ v_{i1}\ v_{i3}\ v_{i7}\ v_{i2}\ v_{i4}\ v_{i5}\ v_{i6}],$$

and $$\hat{w}_i = [w_{i0}\ w_{i4}\ w_{i1}\ w_{i5}\ w_{i2}\ w_{i6}\ w_{i3}\ w_{i7}].$$

The multiplication by $H_8$ is most easily done using the fast Hadamard transform.

In the fourth step, the 256 correlations are determined as the real par of the complex numbers $z_{ikl}$ defined as $$z_{ikl} = w_{ik}(j)^l\ \forall 0 \leq i \leq 7,\ 0 \leq k \leq 7,\ 0 \leq l \leq 3.$$

In the fifth and final step, the message quaternary symbols $m_0, m_1, m_2, m_3$ corresponding to a given i,k,l are determined using $$m_0 = 1$$
$$m_1 = (i_1 + 2k_1 + l) \bmod 4$$
$$m_2 = (i_2 + 2k_2 + l) \bmod 4$$
$$m_3 = (i_3 + 2k_3 + l) \bmod 4$$

where $i_1, i_2, i_3$ is the binary representation of i and $k_1, k_2, k_3$ is the binary representation of k, i.e., $$i = 4i_1 + 2i_2 + i_3,\ 0 \leq i_1, i_2, i_3 \leq 1,$$

and $$k = 4k_1 + 2k_2 + k_3,\ 0 \leq k_1, k_2, k_3 \leq 1.$$

This step may be done off line and the mappings of i,k,l to message quaternary symbols $m_0, m_1, m_2, m_3$ stored in the form of a table. This concludes the Hadamard transform based fast correlation computation method.

In order to evaluate the effectiveness of the NBC based channel codec, a reference baseline convolutional channel codec employing approximately the same number of Class 1 bits, Class 2 bits, PMSB bits, CRC bits and a similar interleaver was used. A constraint length of k=7 was used. Thus, the convolutional channel codec used as a reference had a complexity greater than the NBC to which it was being compared. TIA supplied error masks with fourteen bits of soft decision magnitude were used to make the comparison. The measures of performance used to make the comparison were bad frame error rate denoted as CRC WER, Class 1 BER, and Class BER. These measures were determined by simulations using 25,000 slots and listed in Table 5 for all vehicle speeds at the worst case channel BER of 3%.

TABLE 5

PERFORMANCE COMPARISON OF CONVOLUTIONAL CODE WITH NBC FOR 3% RAW CHANNEL BER

| Speed (mph) | CRC WER Conv | CRC WER NBC | Class 1 BER Conv | Class 1 BER NBC | Class 2 BER Conv | Class 2 BER NBC |
|---|---|---|---|---|---|---|
| 5 | 1.53% | 1.16% | 0.70% | 0.31% | 1.73% | 0.61% |
| 30 | 0.69% | 0.35% | 0.29% | 0.10% | 0.87% | 0.28% |
| 60 | 0.26% | 0.06% | 0.11% | 0.03% | 0.39% | 0.13% |

It is evident from Table 5 that the NBC based design outperforms the convolutional channel codec at all speeds and with all performance measures despite its lower cost of realization.

In conclusion, it should be understood that the use of NBC code for voice transmission purposes is not restricted to just the 9/16 and 8/14 codes used in the preferred embodiment. A stronger 7/16 code can be obtained by selecting an eighth parity bits for every seven message bits such that the sum of the message quaternary symbols has an even parity and then using the (16,8,6) Nordstrom Robinson code to encode the eight bits. An even stronger 9/14 code can be obtained 10/16 shortening the basic (16,8,6) NBC code. Weaker 9/16 and 10/16 codes may be obtained directly rather than by puncturing the NBC code. It should be evident to those experienced in the art that the encoding and decoding processes described for the preferred embodiment are also applicable to these other variations of the NBC code. We also emphasize that while the channel codec has been used effectively for voice transmission purposes in the preferred emobiment, its use is not confined to protecting speech data. It can also be used to protect signaling data, video dam as well as any other data to protect the dam in a fading channel environment.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of encoding a bitstream for transmission over a time division multiplexed radio channel, the radio channel being divided into a series of time slots and subject to fading, the method comprising the steps of:

classifying incoming bits from the bitstream into at least three classes, which include a Class 1, a Class 2 and a Class 3;

generating check bits using a nonlinear convolutional code for a subset of the incoming bits classified as Class 1 bits, the nonlinear convolutional code being a cyclic redundancy code;

encoding the Class 1 bits and the generated check bits using a first block encoder using a nonlinear block code (NBC);

encoding the Class 2 bits using a second block encoder using an NBC; and interleaving the encoded and the nonencoded bits in an interleaving matrix over a plurality of time slots, wherein the subset of incoming bits classified as Class 1 bits constitute 24 bits and the cyclic redundancy code is an 8 bit code.

2. A method of encoding a bitstream for transmission over a time division multiplexed radio channel, the radio channel being divided into a series of time slots and subject to fading, the method comprising the steps of:

classifying incoming bits from the bitstream into at least three classes, which include a Class 1, a Class 2 and a Class 3;

generating check bits using a nonlinear convolutional code for a subset of the incoming bits classified as Class 1 bits;

encoding the Class 1 bits and the generated check bits using a first block encoder using a nonlinear block code (NBC);

encoding the Class 2 bits using a second block encoder using an NBC; and interleaving the encoded and the nonencoded bits in an interleaving matrix over a plurality of time slots, wherein the first block encoder is a rate 9/16 NBC encoder and the second block encoder is a rate 8/14 NBC encoder.

3. A method of decoding a bitstream received from a time division multiplexed radio channel, the channel being divided into a series of time slots, the method comprising the steps of:

receiving interleaved encoded and nonencoded bits;

deinterleaving the received bits and placing them in a matrix array;

extracting and classifying the deinterleaved bits into at least three classes, which include a Class 1, a Class 2 and a Class 3;

classifying each decoded Class 1 bit into one of a plurality of subclasses, wherein a first subclass is designated as perceptually most significant bits (PMSBs) and a second subclass is designated as nonlinear convolutional code bits;

using the PMSBs, generating check bits for the Class 1 bits classified in the PMSB subclass using a nonlinear convolutional code;

comparing the generated check bits with the transmitted check bits;

generating an error signal if the generated check bits are not equal to the transmitted check bits;

decoding the Class 1 bits in a first nonlinear block decoder;

decoding the Class 2 bits in a second nonlinear block decoder; and multiplexing the decoded and nonencoded bits into a frame.

4. The method of claim 3, wherein the step of generating check bits further comprises the steps of:

producing multiple candidates for a PMSB code word, each candidate comprising a series of PMSB bits;

generating check bits for each of the produced multiple candidates; and comparing each of the generated check bits with the received check bits, wherein the error signal generation step generates the error signal only if the received check bits are not equal to any of the generated check bits.

5. The channel decoding method recited in claim 4 further comprising the steps of:

providing a table of entries representing a subset of possible PMSB candidates, wherein the table entries are the candidates produced to represent the PMSB code word; and extracting check bits from message bits corresponding to each table entry.

6. The channel decoding method recited in claim 3 wherein the first block decoder is a rate 9/16 NBC decoder and the second block decoder is a rate 8/14 NBC decoder.

7. The method of claim 3 wherein the nonlinear block code is a quarternary Nordstrom-Robinson code.

8. The method of claim 3 wherein the nonlinear convolutional code is a cyclic redundancy check code.

9. The method of claim 3 wherein the step of decoding the Class 2 bits in a second nonlinear block decoder comprises decoding the PMSBs as a first subset of the Class 1 bits and decoding the nonlinear convolutional code bits separately as a second subset of the Class 1 bits.

10. A radio channel decoder for a time division multiplexed radio channel divided into a series of time slots and subject to fading comprising:

a receiver receiving interleaved encoded and nonencoded bits and placing the received bits from at least two different time slots in a deinterleaving matrix array, the encoded and nonencoded bits corresponding to multiple distinct classes, bits of a most important one of said classes being referred to as Class 1 bits;

a two slot deinterleaver extracting the encoded and nonencoded bits from the deinterleaving matrix array;

a first block decoder decoding the Class 1 bits and any check bits applied to a subset of the Class 1 bits, the subset consisting of perceptually most significant bits (PMSBs) all of which were encoded using a nonlinear block code (NBC);

a second block decoder decoding other encoded bits which were also encoded using an NBC; and a multiplexer combining the decoded Class 1 bits, other decoded bits, and nonencoded bits in a frame comprising a fixed number of data bits.

11. The channel decoder of claim 10 wherein the block decoder for coded Class 1 PMSBs is a generalized decoder which produces multiple candidates for each decoded PMSB code word and compares locally generated check bits for all combinations of candidates with received check bits and sets a bad frame flag only when no coincidence is found between the received check bits and the locally generated check bits of all combinations of candidates.

12. The channel decoder of claim 10 wherein the block decoder for coded Class 1 PMSBs includes a table of a subset of possible combinations of candidates for PMSBs, check bits being extracted from message bits corresponding to candidates for PMSBs in said table.

* * * * *